United States Patent
Yoshikawa et al.

(10) Patent No.: US 9,244,343 B2
(45) Date of Patent: Jan. 26, 2016

(54) PATTERN FORMING METHOD AND MASK PATTERN DATA

(71) Applicant: KABUSHIKI KAISHA TOSHIBA, Tokyo (JP)

(72) Inventors: Ryoji Yoshikawa, Kanagawa-ken (JP); Hideaki Sakurai, Kanagawa-ken (JP); Shunsuke Ochiai, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/191,110

(22) Filed: Feb. 26, 2014

(65) Prior Publication Data

US 2015/0021295 A1 Jan. 22, 2015

(30) Foreign Application Priority Data

Jul. 16, 2013 (JP) .................................. 2013-147957

(51) Int. Cl.
*G03F 7/00* (2006.01)
*B82Y 10/00* (2011.01)
*B82Y 40/00* (2011.01)

(52) U.S. Cl.
CPC ............... *G03F 7/0002* (2013.01); *B82Y 10/00* (2013.01); *B82Y 40/00* (2013.01)

(58) Field of Classification Search
CPC ..................... H01L 21/31144; H01L 21/0337; G03F 7/0002; B29C 59/16
USPC .......................................................... 216/41
See application file for complete search history.

(56) References Cited

U.S. PATENT DOCUMENTS

2012/0127454 A1   5/2012 Nakamura et al.
2013/0075360 A1*  3/2013 Nakamura et al. .............. 216/41

FOREIGN PATENT DOCUMENTS

JP        2012-108369        5/2012

* cited by examiner

*Primary Examiner* — Duy Deo
*Assistant Examiner* — Mahmoud Dahimene
(74) *Attorney, Agent, or Firm* — Patterson & Sheridan, LLP

(57) ABSTRACT

According to one embodiment, a pattern forming method includes: forming a guide layer, including a base layer and a neutralization film with a plurality of parallel line sections, on a processing target film, forming a polymer material containing first polymer segments and second polymer segments, on the guide layer, forming a self-assembly pattern having a plurality of first polymer portions containing the first polymer segment and extending in a direction of the line sections, and a plurality of second polymer portions containing the second polymer segment alternating with the first polymer portions and extending along the direction of the line sections, and selectively removing the second polymer portions. The widths of line sections of both ends of the plurality of line sections of the neutralization film are about two times the width of each first polymer portion or each second polymer portion.

19 Claims, 10 Drawing Sheets

1

PATTERN FORMING METHOD AND MASK PATTERN DATA

CROSS-REFERENCE TO RELATED APPLICATION

This application is based upon and claims the benefit of priority from Japanese Patent Application No. 2013-147957, filed Jul. 16, 2013, the entire contents of which are incorporated herein by reference.

FIELD

Embodiments described herein relate generally to a pattern forming method and mask pattern data.

BACKGROUND

Known lithography technologies utilized in manufacturing semiconductor devices include double patterning technology using ArF immersion exposure, EUV lithography, nanoimprint, and others. The lithography technologies according to the related art suffer from a variety of problems such as an increase in cost, and a decrease in throughput as pattern features have become smaller.

Under such circumstances, the application of directed self-assembly (DSA) to lithography technologies has been considered. Self-assembly is achieved by energy stabilization in fluid materials to form patterns therefrom having a high degree of dimensional accuracy. Especially, a technology using microphase separation of a block copolymer can form periodic structures in a variety of shapes with dimensions of several nanometers (nm) to several hundred of nanometers (nm) by a simple coating and an annealing process. Microphase separation causes the block copolymer to change into spherical shapes (a sphere), columnar shapes (a cylinder), layer shapes (a lamella), and the like, according to the composition ratio of the components of the block copolymer, making it possible to form self-assembly patterns in a variety of shapes and dimensions.

DETAILED DESCRIPTION

An object of the present disclosure is to provide a pattern forming method and mask pattern data capable of forming a self-assembly pattern in a desired area.

In general, according to one embodiment, a pattern forming method includes: forming a guide layer, including a base layer and a neutralization film with a plurality of line sections, on a processing target film, the plurality of line sections being parallel to each other forming a polymer material containing first segments and second segments, on the guide layer; performing microphase separation of the polymer material to form a self-assembly pattern in which first polymer portions containing the first segments and extending along the line sections, and second polymer portions containing the second segments and extending along the line sections are alternately disposed; and selectively removing the second polymer portions. The widths of line sections of both ends of the plurality of line sections of the neutralization film are about two times the width of each first polymer portion or each second polymer portion.

Hereinafter, embodiments of the present disclosure will be described on the basis of the accompanying drawings.

First Embodiment

A pattern forming method an etch mask according to a first embodiment will be described with reference to FIGS. 1A to 7B. FIGS. 1A, 2A, 3A, 4A, 5A, 6A and 7A show top surfaces, and FIGS. 1B, 2B, 3B, 4B, 5B, 6B and 7B show cross sections taken along lines A-A of FIGS. 1A, 2A, 3A, 4A, 5A, 6A and 7A, respectively.

Figure 1A:
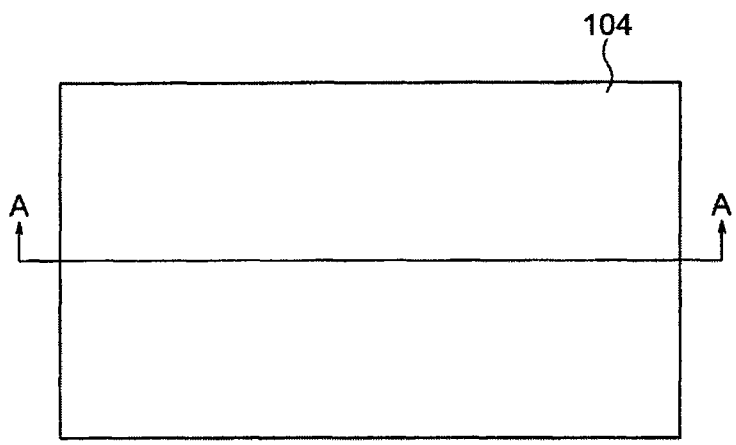
FIGS. 1A and 1B are a top view and a cross-sectional view, respectively, illustrating a pattern forming method according to a first embodiment.
Figure 1B:
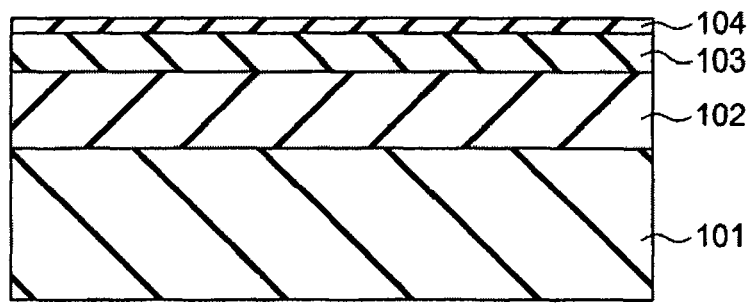

As shown in FIGS. 1A and 1B, a processing target film 101 is formed, on a semiconductor substrate (not shown), and on the processing target film 101, a hard mask material 102 is formed. Further, on the hard mask material 102, a base guide layer 103 and a neutralization film 104 are sequentially formed to form a mask substrate. The processing target film 101 may be an oxide film such as a TEOS film of a film thickness of about 300 nm.

The hard mask material 102 is provided for transferring a microphase separation pattern of a block copolymer, to be formed in a subsequent process, to the processing target film 101. The hard mask material 102 can be formed by depositing a carbon film having a film thickness of about 100 nm, for example, by chemical vapor deposition (CVD).

The base guide layer 103 and the neutralization film 104 act as guides for forming the microphase separation pattern of the block copolymer in the subsequent process. The base guide layer 103 can be formed by depositing a silicon oxide film of a film thickness of about 15 nm, for example, by CVD.

The neutralization film 104 is neutral with respect to two polymer segments of the block copolymer to be used in the subsequent process. The neutralization film 104 can be formed, for example, by dissolving a random copolymer of polystyrene (PS) and polymethylmethacrylate (PMMA) in polyethylene glycol monomethyl ether acetate (PGMEA) at a concentration of 1.0 wt %, and applying the solution by spin coating at 2000 rpm, and performing baking on a hotplate at 110° C. for 90 seconds, and then performing baking at 240° C. for 3 minutes.

Figure 2A:
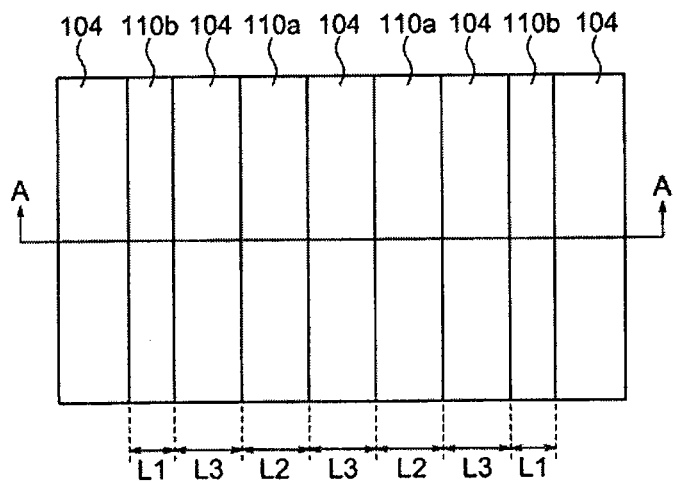
FIGS. 2A and 2B are a top view and a cross-sectional view, respectively, illustrating a process subsequent to the process shown in FIGS. 1A and 1B, respectively.
Figure 2B:
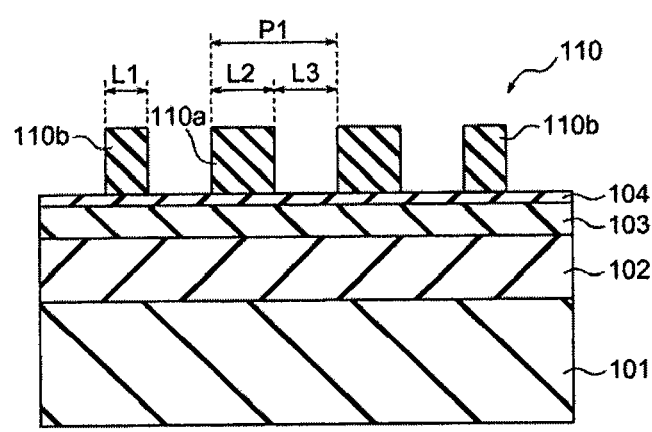

Next, a resist is applied over the neutralization film 104 by spin coating, and is exposed and developed, whereby a resist pattern 110 having a line-and-space pattern is formed, as shown in FIGS. 2A and 2B. The film thickness of the applied resist is, for example, 100 nm. Also, the exposure of the resist for forming a pattern therein may be performed with a dose of 20 mJ/cm$^2$ by an ArF excimer laser.

A pitch P1 of the resist pattern 110 is determined on the basis of the molecular weight and composition ratio of the block copolymer to be used in the subsequent process. The pitch P1 may be about three times the pitch (a pitch P2 of FIG. 5B) of the self-assembly pattern to be formed by microphase separation of the block copolymer into a lamella shape. Also, each of widths L1 of line sections 110b at opposed ends of the resist pattern 110 have the same as the pitch (the pitch P2 of FIG. 5B) of the self-assembly pattern. In the central area of the resist pattern 110 (area between the opposed ends), each of widths L2 of line sections 110a and widths L3 of space sections are about 1.5 times the pitch (the pitch P2 of FIG. 5B) of the self-assembly pattern.

For example, in a case where the pitch (the pitch P2) of the self-assembly pattern is 30 nm, the widths L1 of the line sections 110b at opposed ends is 30 nm, and the widths L2 of the line sections 110a of the central area and the widths L3 of the space sections of the central area become 45 nm (30 nm×1.5), and the pitch P1 of the line-and-space pattern of the resist 110 are 90 nm (30 nm×3).

In order to form this resist pattern 110, the pitch of the self-assembly pattern is used to generate mask pattern data in a computer as a first step. Next, on the basis of the mask pattern data, a mask for exposure is manufactured. Subsequently, the mask for exposure is used to perform exposure of the pattern in the resist layer, and the resist is then developed, whereby it is possible to form the resist pattern 110.

Figure 3A:
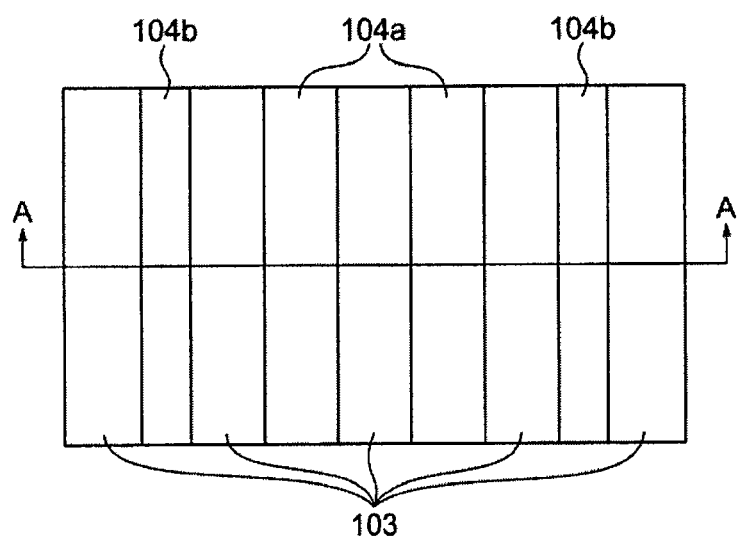
FIGS. 3A and 3B are a top view and a cross-sectional view, respectively, illustrating a process subsequent to the process shown in FIGS. 2A and 2B, respectively.
Figure 3B:
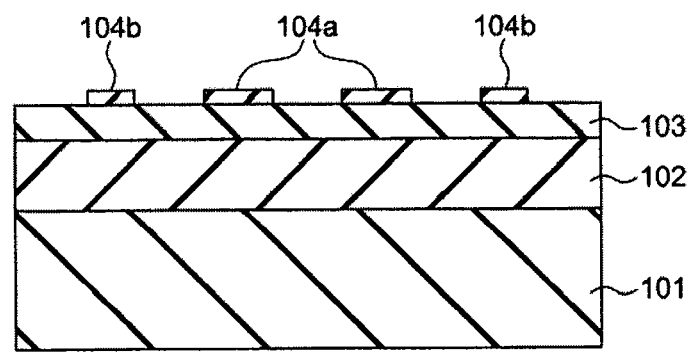

Next, the resist pattern 110 is used as a mask to process the neutralization film 104 into a line-and-space shape as shown in FIGS. 3A and 3B. The processing of the neutralization film 104 may be performed by oxygen RIE (reactive ion etching). After the processing of the neutralization film 104, the resist pattern 110 is stripped off by use of a solvent, or the like. The resulting patterned neutralization film 104 includes a plurality of line-shaped neutralization films 104a and 104b formed in parallel along a predetermined direction. The neutralization films 104b positioned at the opposed ends correspond to the line sections 110b, and the neutralization films 104a therebetween are positioned at the central area to correspond to the line sections 110a.

Figure 4A:
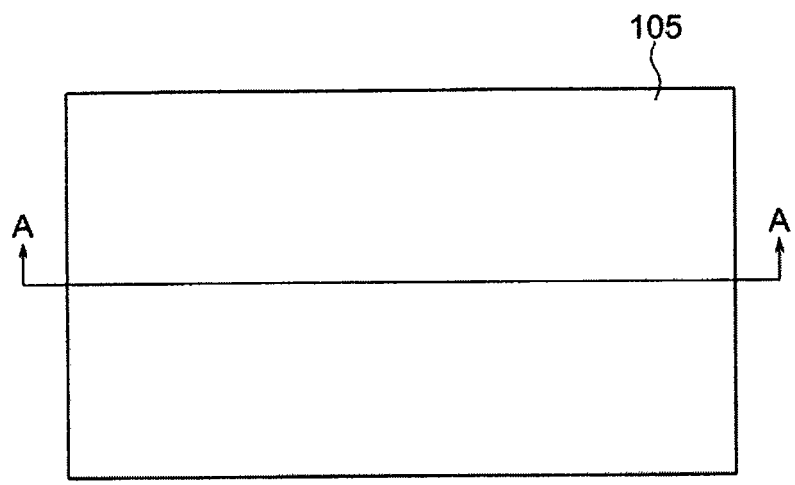
FIGS. 4A and 4B are a top view and a cross-sectional view, respectively, illustrating a process subsequent to the process shown in FIGS. 3A and 3B, respectively.
Figure 4B:
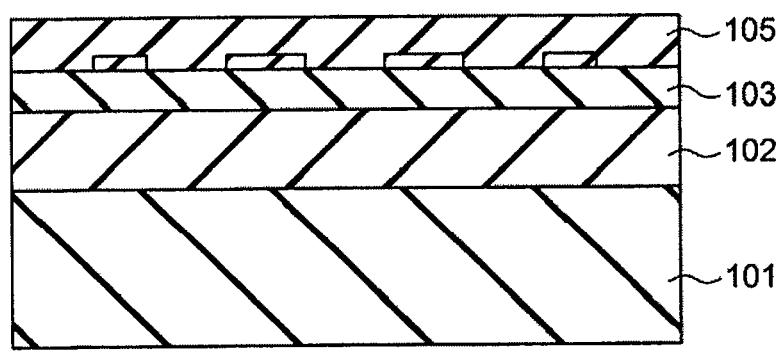

Next, as shown in FIGS. 4A and 4B, a block copolymer 105 is applied on the base guide layer 103 and the neutralization film 104. The block copolymer bonds to the base guide layer 103 and the neutralization film 104 and includes first polymer block chains and second polymer block chains.

Figure 5A:
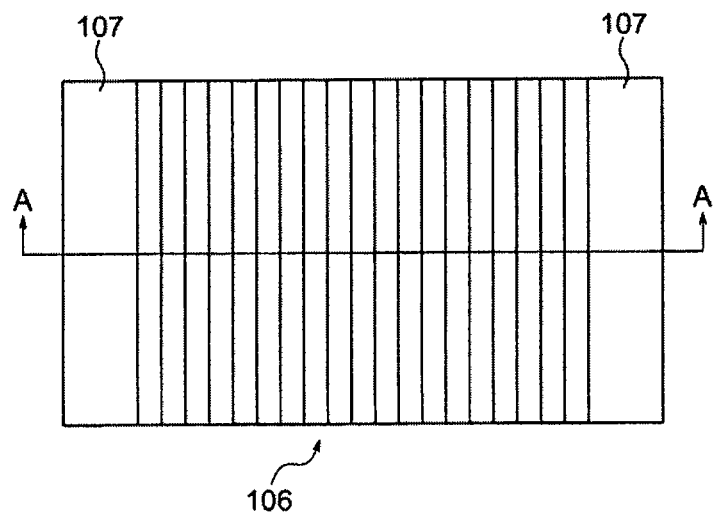
FIGS. 5A and 5B are a top view and a cross-sectional view, respectively, illustrating a process subsequent to the process shown in FIGS. 4A and 4B, respectively.
Figure 5B:
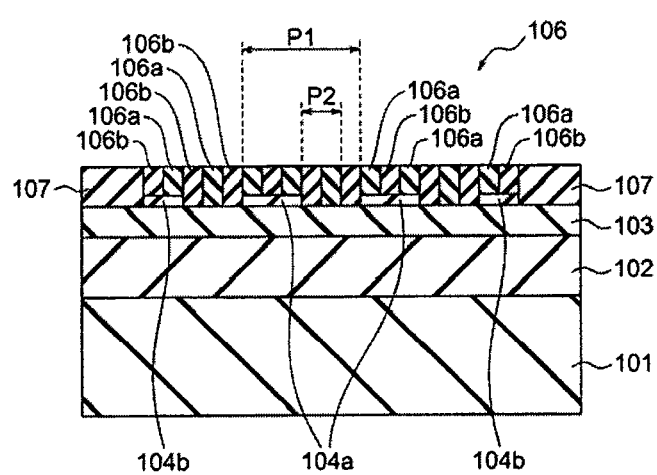

Next, the block copolymer 105 is heated and a lamellar microphase separation structure film (a self-assembly pattern 106) is formed by microphase separation as shown in FIGS. 5A and 5B. The self-assembly pattern 106 comprises alternating linear-shaped thin-films having first polymer portions 106a containing the first polymer block chains (first segments) and linear-shaped thin-films having second polymer portions 106b containing the second polymer block chains (second segments). The base guide layer 103 and the neutralization film 104 act as so-called chemical guides, such that the lamellar first polymer portions 106a and the lamellar second polymer portions 106b are aligned with the neutralization film 104. More particularly, the first polymer portions 106a containing the first segments and extending along the vertical direction of FIG. 5A, and the second polymer portions 106b containing the second segments and extending along the vertical direction of FIG. 5A are alternately disposed along the left-right direction of the FIG. 5A, in the self-assembly pattern 106.

The pitch P1 of the line-and-space pattern of the neutralization film 104 is about three times the pitch P2 of the self-assembly pattern 106. The base guide layer 103 (exposed in the space sections between adjacent line portions of the neutralization films 104 of the line-and-space pattern) form pinning areas, and the first polymer portions 106a are formed in the center of the surface of the base guide layer 103. Also, due to the characteristics of lamellar microphase separation, the first polymer portions 106a and the second polymer portions 106b are alternately formed.

As shown in FIGS. 5A and 5B, over the line or strip shaped neutralization films 104a of the central area between opposed ends, the first polymer portions 106a are formed with the second polymer portions 106b interposed therebetween. Also, on the neutralization films 104b at the opposed ends, the first polymer portions 106a are formed on the inner side (on the central area side) and the second polymer portions 106b are formed on the outer side of the first polymer portions 106a.

Also, in areas outside of the neutralization films 104b at the opposed ends, regular phase separation of the block copolymer 105 does not occur. Thus, at the ends of the pattern, the block copolymer 105 is a mixed polymer 107 which is a mixture of the first polymer block chains and the second polymer block chains that are not phase separated.

As the block copolymer 105, it is possible to use, for example, a block copolymer of polystyrene (PS) and polymethylmethacrylate (PMMA). The value of [AVERAGE MOLECULAR WEIGHT OF PS BLOCKS]/[AVERAGE MOLECULAR WEIGHT OF PMMA BLOCKS] is, for example, 21,000/21,000. This block copolymer is dissolved in PGMEA at the concentration of about 1.0 wt %, and this solution is applied at 2000 rpm by spin coating. Next, baking is performed at 110° C. for 90 seconds, and then an annealing process is performed in nitrogen atmosphere at 220° C. for 3 minutes to separate the block copolymer into a lamellar domain having linear portions with a half-pitch of 15 nm. In this case, the first polymer portions 106a become the PS phase, and the second polymer portions 106b become the PMMA phase.

Figure 6A:
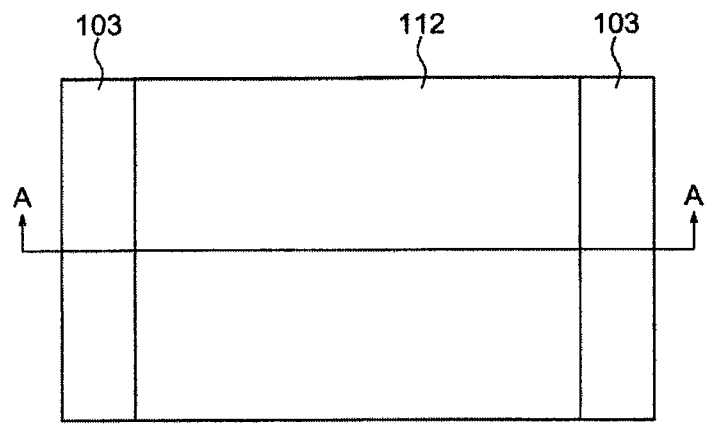
FIGS. 6A and 6B are a top view and a cross-sectional view, respectively, illustrating a process subsequent to the process shown in FIGS. 5A and 5B, respectively.
Figure 6B:
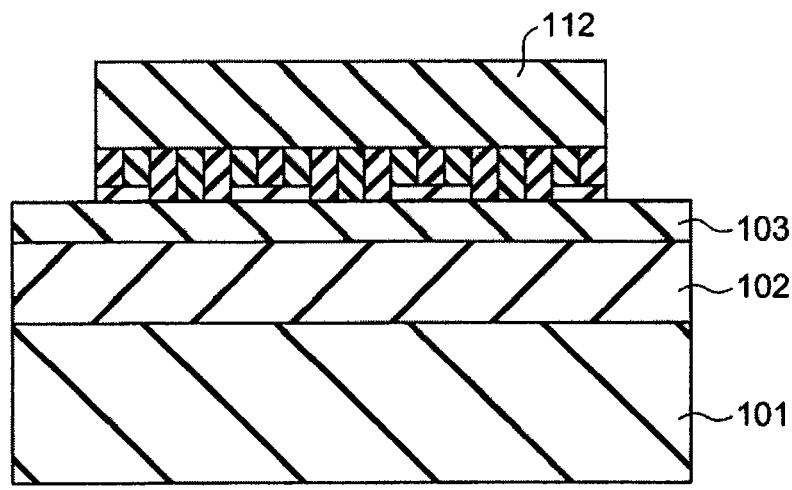

Next, as shown in FIGS. 6A and 6B, a resist 112 is formed to cover the self-assembly pattern 106 (shown in FIG. 5B) leaving the mixed polymer 107 of the areas outside of the neutralization films 104b at both ends (shown in FIG. 5B) exposed. Subsequently, the resist 112 is used as a mask to perform RIE, whereby the mixed polymer 107 is removed. After the removal of the mixed polymer 107 at opposed end, the resist 112 is stripped off.

Figure 7A:
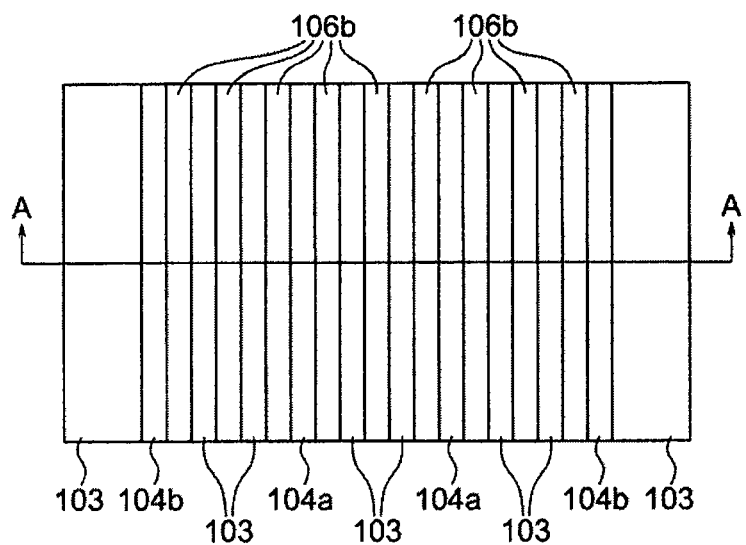
FIGS. 7A and 7B are a top view and a cross-sectional view, respectively, illustrating a process subsequent to the process shown in FIGS. 6A and 6B, respectively.
Figure 7B:
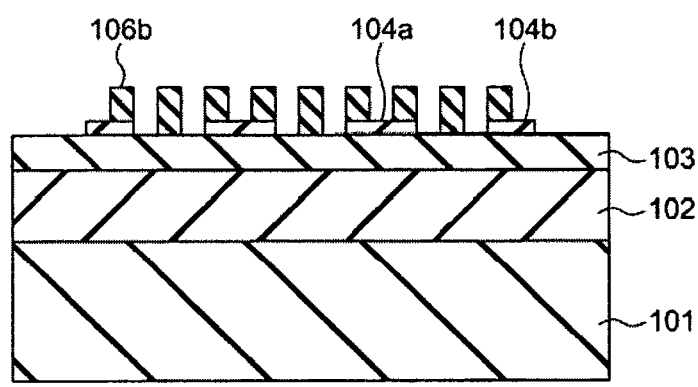

Next, a wet developing process is performed to selectively remove the second polymer portions 106b while leaving the first polymer portions 106a remain as shown in FIGS. 7A and 7B. For example, ultraviolet light is irradiated onto the self-assembly pattern 106, and then a developer is provided to the self-assembly pattern 106. If ultraviolet light is utilized, PMMA is oxidized by oxygen and/or water in the atmosphere, so as to be soluble in the developer. As the developer, it is possible to use a variety of developers usable for developing exposed photoresist films in photolithography technologies. As an example, tetramethylammonium hydroxide (TMAH) can be used.

Although not shown in the drawings, the openings formed where the second polymer portions 106b were removed, and the remaining first polymer portions 106a, are used as a mask to process the base guide layer 103 after the wet developing process. In this way, the line-and-space shape is transferred to the base guide layer 103. Next, the base guide layer 103 is used as a mask to process the hard mask material 102 by RIE or the like. In this way, the line-and-space shape is transferred to the hard mask material 102. Next, the hard mask material 102 is used as a mask to process the processing target film 101 by RIE or the like. In this way, it is possible to transfer the line-and-space pattern to the processing target film 101.

As shown in FIGS. 5A and 5B, on the neutralization films 104b at the opposed ends, the second polymer portions 106b to be removed by the wet developing process are formed on the outer side of the first polymer portions 106a. Therefore, when the resist 112 is formed in the process shown in FIGS. 6A and 6B, it is possible to use an alignment margin corresponding to the widths of those second polymer portions 106b at the opposed ends. Thus, it is possible to easily remove the mixed polymer 107 while leaving the first polymer portions 106a at the opposed ends in the subsequent process.

As described above, according to the present embodiment, it is possible to form a self-assembly pattern in a desired area.

In the above described embodiment, an example in which the block copolymer of polystyrene (PS) and polymethylmethacrylate (PMMA) is used as the block copolymer has been described. However, any other materials such as a block copolymer of polystyrene (PS) and polydimethylsiloxane (PDMS) may be used.

Second Embodiment

Figure 8A:
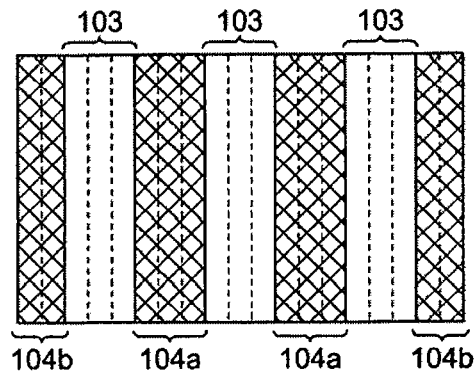
FIGS. 8A to 8C are top views illustrating chemical guides according to a second embodiment.

In the above described first embodiment, the chemical guides are composed of the neutralization film 104 and pinning areas (the exposed portions of the base guide layer between the line shaped neutralization films 104a in the first embodiment) 103, and the width of each neutralization film 104a in the central area (area between the opposed ends) are about 1.5 times the pitch P2 of the self-assembly pattern 106, in other words, about three times the width of each first polymer portion 106a or each second polymer portion 106b. Also, the widths of the neutralization films 104b at the opposed ends is the same as the pitch P2 of the self-assembly pattern 106, in other words, about two times the width of each first polymer portion 106a or each second polymer portion 106b. Further, the widths of the pinning areas 103 is about 1.5 times the pitch P2 of the self-assembly pattern 106 (shown in dashed lines in FIGS. 8A-8C), in other words, about three times the width of each first polymer portion 106a or each second polymer portion 106b (see FIG. 8A).

Therefore, after the wet developing process is performed so as to selectively remove the second polymer portions 106b, the number of remaining first polymer portions 106a becomes 3n (n is an integer equal to or greater than 1).

The number of first polymer portions 106a remaining after the wet developing process can be changed by adjusting the widths of the neutralization films 104b at the opposed ends.

Figure 8B:
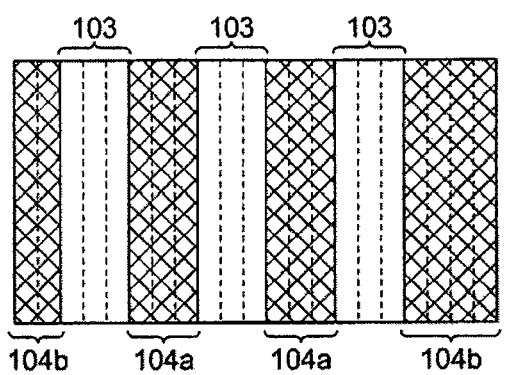

For example, if the width of one of the neutralization films 104b at one of the opposed ends is set to about 1.5 times or about two times the pitch P2 of the self-assembly pattern 106, (in other words, about three times or about four times the width of each first polymer portion 106a or each second polymer portion 106b) the number of the first polymer portions 106a that remain after the wet developing process becomes (3n+1). FIG. 8B shows a case where the width of one of the neutralization films 104b at the opposed ends has been set to about two times the pitch P2 of the self-assembly pattern 106, (in other words, about four times the width of each first polymer portion 106a or each second polymer portion 106b).

Figure 8C:
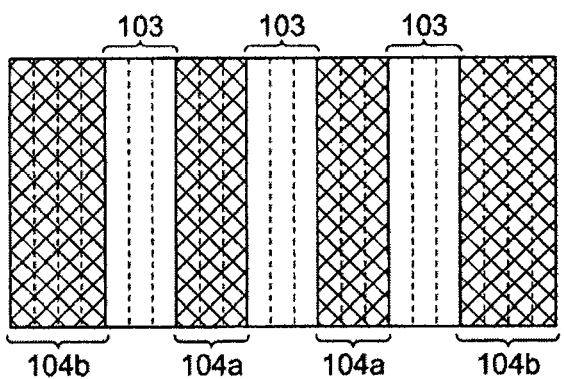

Also, if the widths of the neutralization films 104b at the opposed ends are set to about 1.5 times or about two times the pitch P2 of the self-assembly pattern 106, (in other words, about three times or about four times the width of each first polymer portion 106a or each second polymer portion 106b) the number of the first polymer portions 106a that remain after the wet developing process becomes (3n+2). FIG. 8C shows a case where the widths of the neutralization films 104b of both of the opposed ends have been set to about two times the pitch P2 of the self-assembly pattern 106, (in other words, about four times the width of each first polymer portion 106a or each second polymer portion 106b).

Figure 9A:
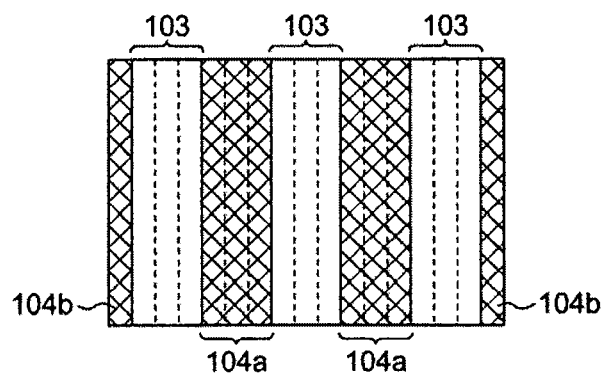
FIGS. 9A to 9C are top views illustrating other chemical guides according to the second embodiment.

The above described examples relate to a case where the pinning areas 103 are hydrophilic. In a case where the pinning areas 103 are hydrophobic, the positions of the first polymer portions (PS phase) 106a and the second polymer portions (PMMA phase) 106b are reversed. In this case, if the widths of the neutralization films 104b at the opposed ends are set to half of the pitch P2 of the self-assembly pattern 106 (shown in dashed lines in FIGS. 9A-9C), in other words, the same width as the width of each first polymer portion 106a or each second polymer portion 106b (see FIG. 9A), the number of the first polymer portions 106a that remain after the wet developing process becomes (3n+2).

Figure 9B:
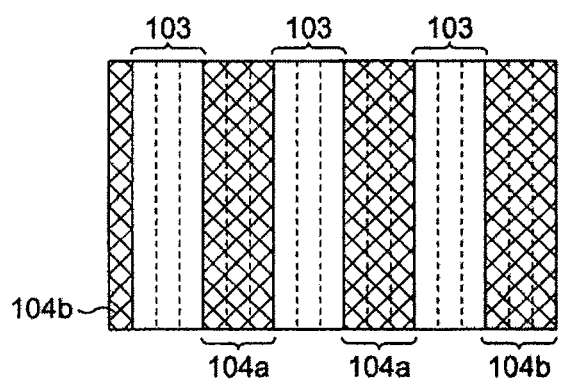

In the case where the pinning areas 103 are hydrophobic, if the width of one of the neutralization films 104b of both ends is set to half of the pitch P2 of the self-assembly pattern 106, (in other words, the same width as the width of each first polymer portion 106a or each second polymer portion 106b), and the width of the other neutralization film 104b is set to one time or about 1.5 times the pitch P2 of the self-assembly pattern 106, (in other words, about two times or about three times the width of each first polymer portion 106a or each second polymer portion 106b) the number of the first polymer portions 106a that remain after the wet developing process becomes 3n. FIG. 9B shows a case where the width of one of the neutralization films 104b at the opposed ends has been set to the same width as the width of each first polymer portion 106a, and the width of the other neutralization film 104b at the opposed ends has been set to about three times the width of each first polymer portion 106a.

Figure 9C:
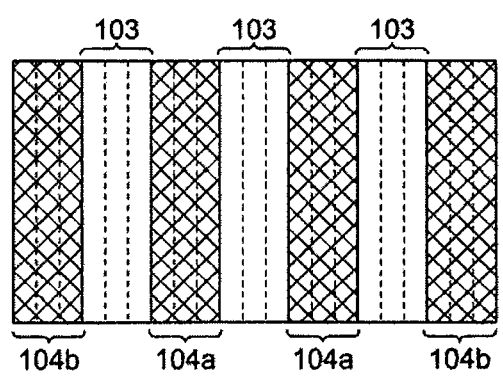

Also, in the case where the pinning areas 103 are hydrophobic, if the widths of the neutralization films 104b at the opposed ends are set to one time or about 1.5 times the pitch P2 of the self-assembly pattern 106, (in other words, about two times or about three times the width of each first polymer portion 106a or each second polymer portion 106b) the number of the first polymer portions 106a that remain after the wet developing process becomes (3n+1). FIG. 9C shows a case where the widths of the neutralization films 104b at the opposed ends have been set to about three times the width of each first polymer portion 106a.

Not only the widths of the neutralization films 104b at the opposed ends, but also the widths of the neutralization films 104a of the central area other than at the opposed ends, and the widths of the pinning areas 103 may be adjusted. Because of the characteristics of the lamellar microphase separation, the widths of the neutralization films 104a and the pinning areas 103 are set to substantially odd multiples of the width of each first polymer portion 106a (or each second polymer portion 106b).

Figure 10A:
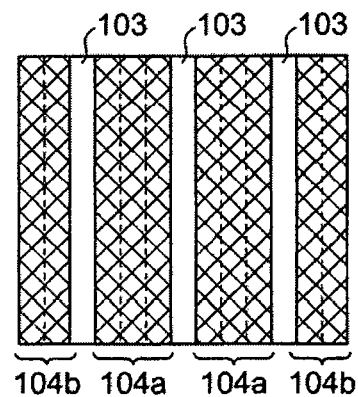
FIGS. 10A to 10C are top views illustrating other chemical guides according to the second embodiment.
Figure 10B:
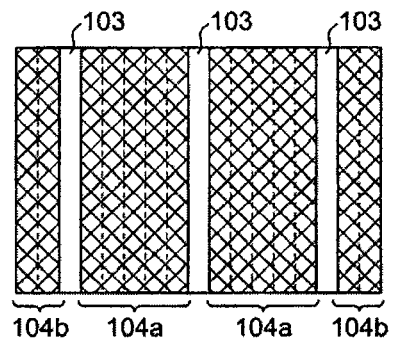
Figure 10C:
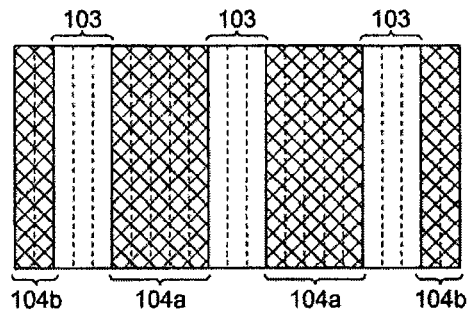

For example, as shown in FIG. 10A, the widths of the neutralization films 104b at the opposed ends may be set to about two times the width of each first polymer portion 106a or each second polymer portion 106b (shown in dashed lines in FIGS. 10A-10C). The widths of the neutralization films 104a of the central area may be set to about three times the width of each first polymer portion 106a or each second polymer portion 106b. The widths of the pinning areas 103 may be set to one time the width of each first polymer portion 106a or each second polymer portion 106b.

Also, as shown in FIG. 10B, the widths of the neutralization films 104b at the opposed ends may be set to about two times the width of each first polymer portion 106a or each second polymer portion 106b. The widths of the neutralization films 104a of the central area may be set to about five times the width of each first polymer portion 106a or each second polymer portion 106b. The widths of the pinning areas 103 may be set to one time the width of each first polymer portion 106a or each second polymer portion 106b.

Also, as shown in FIG. 10C, the widths of the neutralization films 104b at the opposed ends may be set to about two times the width of each first polymer portion 106a or each second polymer portion 106b. The widths of the neutralization films 104a of the central area may be set to about five times the width of each first polymer portion 106a or each second polymer portion 106b. The widths of the pinning areas 103 may be set to about three times the width of each first polymer portion 106a or each second polymer portion 106b.

As described above, if the widths of the neutralization films 104a of the central area (areas between the opposed ends) and the widths of the pinning areas 103 are adjusted, it is possible to set the number of the first polymer portions 106a that remain after the wet developing process, to a desired value. Therefore, it is possible to form a desired line-and-space patterns in a desired area.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method, comprising:
    forming a guide layer, including a base layer and a neutralization film with a plurality of parallel line sections, on a target film to form a mask substrate;
    applying a polymer material on the guide layer, the polymer material containing a first polymer segment and a second polymer segment;
    forming a self-assembly pattern from the polymer material, the self-assembly pattern having a plurality of first polymer portions containing the first polymer segment and extending in a direction of the line sections, and a plurality of second polymer portions containing the second polymer segment alternating with the first polymer portions and extending along the direction of the line sections, wherein the second polymer portions include one that is located at a first outer periphery of the pattern and another that is located at a second outer periphery of the pattern; and
    removing the second polymer portions,
    wherein the widths of line sections at ends of the plurality of line sections of the neutralization film are about two times the width of each first polymer portion or each second polymer portion in a direction perpendicular to the line sections, and the neutralization film is neutral with respect to the first polymer segment and the second polymer segment.

2. The pattern forming method according to claim 1, wherein
    an interval between neighboring line sections is an odd multiple of the width of each first polymer portion or each second polymer portion.

3. The pattern forming method according to claim 2, wherein
    the widths of each of the plurality of line sections in a central area of the neutralization film are about three times the width of each first polymer portion or each second polymer portion.

4. The pattern forming method according to claim 2, further comprising:
    forming a resist film to cover the self-assembly pattern leaving a portion of the mask substrate exposed; and
    etching the mask substrate using the resist film as a mask to remove a mixed polymer outside of the self-assembly pattern.

5. The pattern forming method according to claim 4, wherein the opposed ends of the mask substrate in the direction perpendicular to the line sections include a single first polymer portion adjacent to a central area of the mask substrate, and a single second polymer portion positioned outside of the first polymer portion.

6. The pattern forming method according to claim 2, further comprising;
    forming a resist pattern corresponding to the plurality of line sections on the neutralization film, and
    etching the mask substrate using the resist pattern as a mask to transfer a pattern of the plurality of line sections onto the neutralization film.

7. The pattern forming method according to claim 1, wherein
    the widths of each of the plurality of line sections in a central area of the neutralization film are about three times the width of each first polymer portion or each second polymer portion.

8. The pattern forming method according to claim 7, further comprising:
    forming a resist film to cover the self-assembly pattern leaving a portion of the mask substrate exposed; and
    etching the mask substrate using the resist film as a mask to remove a mixed polymer outside of the self-assembly pattern.

9. The pattern forming method according to claim 8, further comprising;
    forming a resist pattern corresponding to the plurality of line sections on the neutralization film, and
    etching the mask substrate using the resist pattern as a mask to transfer a pattern of the plurality of line sections onto the neutralization film.

10. The pattern forming method according to claim 1, wherein
    removing the second polymer portions includes removing the second polymer portions at opposing ends of the line sections in the direction perpendicular to the line sections.

11. The pattern forming method according to claim 1, wherein
    the guide layer is hydrophilic and the first polymer portion is a polystyrene and the second polymer portion is polymethylmethacrylate.

12. The pattern forming method according to claim 1, wherein the guide layer is hydrophobic and the first polymer portion is a polymethylmethacrylate and the second polymer portion is polystyrene.

13. A pattern forming method, comprising:
forming a mask substrate comprising a guide layer on a target film, the guide layer including a base layer and a neutralization film with a plurality of parallel line sections;
applying a polymer material on the guide layer, the polymer material containing a first polymer segment and a second polymer segment;
heating the polymer material to microphase separate the polymer material forming a self-assembly pattern having a plurality of first polymer portions containing the first polymer segment and extending in a direction of the line sections, and a plurality of second polymer portions containing the second polymer segment alternating with the first polymer portions and extending along the direction of the line sections; and
forming a resist film to cover the self-assembly pattern leaving sides of the self-assembly pattern exposed;
etching the self-assembly pattern using the resist film as a mask to remove the sides of the self-assembly pattern;
wherein:
the widths of line sections at ends of the plurality of line sections of the neutralization film are about two times the width of each first polymer portion or each second polymer portion in a direction perpendicular to the line sections,
the neutralization film is neutral with respect to the first polymer segment and the second polymer segment, and
an interval between neighboring line sections is an odd multiple of the width of each first polymer portion or each second polymer portion.

14. The pattern forming method according to claim 13, wherein
the widths of each of the plurality of line sections in a central area of the neutralization film are about three times the width of each first polymer portion or each second polymer portion.

15. The pattern forming method according to claim 13, wherein
the widths of each of the plurality of line sections in a central area of the neutralization film are about five times the width of each first polymer portion or each second polymer portion.

16. The pattern forming method according to claim 13, wherein both ends of the mask substrate in the direction perpendicular to the line sections include a single first polymer portion adjacent to a central area of the mask substrate, and a single second polymer portion positioned outside of the first polymer portion.

17. The pattern forming method according to claim 13, wherein
the widths of each of the plurality of line sections in a central area of the neutralization film are about five times the width of each first polymer portion or each second polymer portion.

18. The pattern forming method according to claim 17, further comprising;
forming a resist pattern corresponding to the plurality of line sections on the neutralization film, and
etching the mask substrate using the resist pattern as a mask to transfer a pattern of the plurality of line sections onto the neutralization film.

19. A pattern forming method, comprising:
forming a base layer on a processing target film;
forming a neutralization film on the base layer;
forming a resist pattern on the neutralization film;
performing an etching process using the resist pattern as a mask to process the neutralization film and form a guide layer having a plurality of line sections parallel to each other;
coating the guide layer with a polymer material containing first polymer segments and second polymer segments;
heating the polymer material to microphase separate the polymer material forming a self-assembly pattern having a plurality of first polymer portions containing the first polymer segment and extending in a direction of the line sections, and a plurality of second polymer portions containing the second polymer segment alternating with the first polymer portions and extending along the direction of the line sections;
forming a resist film to cover the self-assembly pattern;
performing an etching process using the resist film as a mask to remove sides of the self-assembly pattern; and
removing the second polymer portions,
wherein the widths of line sections at both ends of the plurality of line sections of the neutralization film are about two times the width of each first polymer portion or each second polymer portion in a direction perpendicular to the line sections, the neutralization film being neutral with respect to the first polymer segment and the second polymer segment,
an interval between neighboring line sections is an odd multiple of the width of each first polymer portion or each second polymer portion,
the widths of line sections of the plurality of line sections in a central area of the neutralization film other are about three times or about five times the width of each first polymer portion or each second polymer portion, and
on both ends of the plurality of line sections, one first polymer portion and one second polymer portion are formed such that the second polymer portion is positioned outside of the first polymer portion in the direction perpendicular to the line sections.

* * * * *